United States Patent [19]
Yoon et al.

[11] Patent Number: 5,333,128
[45] Date of Patent: Jul. 26, 1994

[54] SEMICONDUCTOR MEMORY DEVICE HAVING A CIRCUIT FOR REDUCING FREQUENCY OF PROCEEDING REFRESH IN DATA RETENTION MODE

[75] Inventors: Seiseung Yoon, Seoul; Moongone Kim, Kyungki, both of Rep. of Korea

[73] Assignee: Samsung Electronics Co., Ltd., Rep. of Korea

[21] Appl. No.: 912,313

[22] Filed: Jul. 13, 1992

[30] Foreign Application Priority Data

Jul. 16, 1991 [KR] Rep. of Korea ............... 91-12172
May 6, 1992 [KR] Rep. of Korea ............... 92-7670

[51] Int. Cl.⁵ ................................. G11C 7/00
[52] U.S. Cl. ............................ 365/222; 365/230.06
[58] Field of Search .......... 365/222, 230.06, 189.11, 365/233

[56] References Cited

U.S. PATENT DOCUMENTS 4,570,242  2/1986  Nagami ............... 365/222
5,161,120 11/1992  Kajimoto ............ 365/203
5,172,341 12/1992  Amin ................. 365/222

Primary Examiner—Eugene R. LaRoche
Assistant Examiner—A. Zarabian
Attorney, Agent, or Firm—Christie, Parker & Hale

[57] ABSTRACT

A semiconductor memory device of the type needing refresh includes a circuit for reducing the frequency of refresh cycles in data retention mode. A circuit is provided for preventing deterioration to sensing margin of bit lines that may be decreased by a reduction of the frequency of refresh cycles. The deterioration is prevented by increasing the boosting level of word lines.

4 Claims, 1 Drawing Sheet

SEMICONDUCTOR MEMORY DEVICE HAVING A CIRCUIT FOR REDUCING FREQUENCY OF PROCEEDING REFRESH IN DATA RETENTION MODE

BACKGROUND OF THE INVENTION (1) Field of the Invention

The present invention relates to a semiconductor memory device having a circuit for reducing the frequency of refresh cycles in data retention mode. It relates more particularly to a semiconductor memory device having reduced power consumption due to a reduction of the frequency of refresh cycles in data retention mode, but wherein decrease in boosting level of word lines that may occur by the reduction of frequency of the refresh cycle is prevented.

(2) Description of the Prior Art

Semiconductor memory devices are generally divided into a Read Only Memory (ROM) and Random Access Memory (RAM).

RAM includes Static RAM (SRAM) the memory cells of which are formed by flip-flops, each typically made up of four to six transistors; Dynamic RAM (DRAM) the memory cells of which are formed by transistor-capacitor combinations; and Pseudo-SRAM (PSRAM) which uses DRAM-type memory cells each with one MOS transistor and one capacitor, but the peripheral circuits of which have the same structure as the SRAM.

In random access memory, such as DRAM and PSRAM, where memory cells consist of one transistor and one capacitor, data stored in the memory cells decay with time. Accordingly, there is a need for a process of periodically refreshing (in what is commonly referred to as "refresh cycles") the memory cells in order to prevent the data from decaying.

A refresh process is similar to a conventional read/write operation. That is, a refresh cycle is carried out by reading out the data out of the memory and writing it back into the memory.

In prior art semiconductor devices such as DRAM and PSRAM which need refresh, the frequency of refresh cycles is the same in normal access mode and data retention mode (also known as self refresh mode). If the frequency of refresh cycles can be reduced in data retention mode, power consumption of the refresh circuit of the semiconductor memory device is reduced. In reducing the frequency of refresh cycles for achieving the above-identified advantage, the number of memory cells to be refreshed at one time may have to be increased as a function of reduction of the refresh frequency. As a result, the boosting level of word lines may decrease and result in deterioration in sensing margin of bit lines.

SUMMARY OF THE INVENTION

An object of the present invention is to solve the above-mentioned conventional disadvantage, and to provide a semiconductor memory device having a reduced frequency of refresh cycles in data retention mode and a corresponding reduction of power consumption, but wherein the sensing margin of bit lines is not deteriorated.

The above-mentioned object is achieved by a semiconductor memory device which comprises a memory refresh cycle controller for reducing the frequency of refresh cycles in data retention mode in response to a row address signal and a self-refresh signal, a word line boosting level generator for increasing the boosting level of word lines in data retention mode in response to the self refresh signal and a clock enable signal.

BRIEF DESCRIPTION OF THE DRAWINGS

The above and further objects, features and advantages of the present invention will become more apparent from the following detailed description of taken in conjunction with the accompanying drawings, wherein.

DESCRIPTION OF THE PREFERRED EMBODIMENTS

Figure 1:
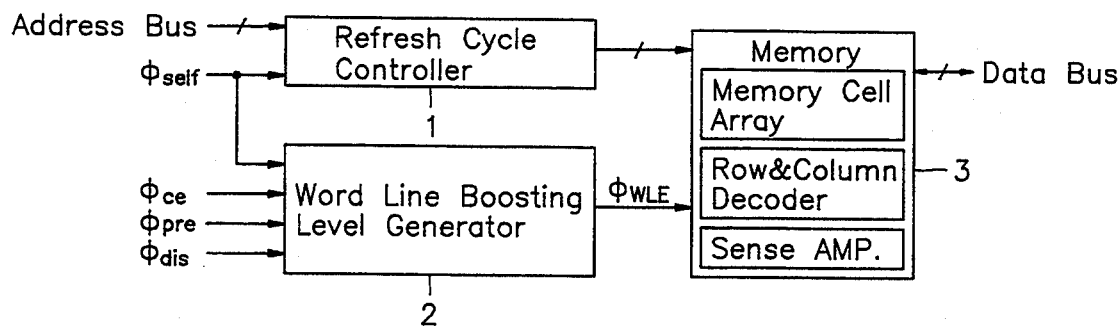
FIG. 1 shows a schematic block diagram of a semiconductor device having a circuit for reducing the frequency of refresh cycles in data retention mode according to a preferred embodiment of the present invention.

Referring now to the drawings, a preferred embodiment of the present invention will be described.

FIG. 1 is a schematic block diagram of a semiconductor memory device having a circuit for reducing the frequency of refresh cycles in data retention mode according to a preferred embodiment of the present invention. The semiconductor memory device having the above-mentioned circuit comprises a memory 3 including a memory cell array, a row and column decoder and a sense amplifier. The memory 3 is connected to the refresh cycle controller 1 and a word line boosting level generator 2. The refresh cycle controller 1 operates to reduce the frequency of refresh cycles in data retention mode utilizing a row address signal from an address bus and a self-refresh signal $\phi$self. The $\phi$self signal is a signal generated internally to indicate that the memory device is in self refresh mode. The word line boosting level generator 2 operates to raise the boosting level of word lines utilizing a self-refresh signal $\phi$self and a clock-enable signal $\phi$ce.

Figure 2:
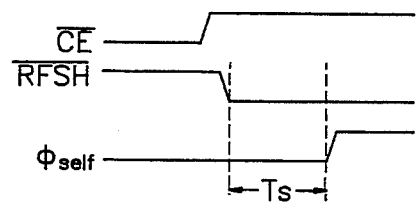
FIG. 2 is a timing diagram showing a refresh cycle for a conventional memory device in data retention mode.

FIG. 2 shows a timing diagram of a refresh cycle for a conventional memory device during data retention mode. As shown, a conventional memory device typically enters data retention mode when a refresh signal $\overline{\text{RFSH}}$ changes to a low level after a chip-enable signal $\overline{\text{CE}}$ changes to a high level. After the memory refresh signal $\overline{\text{RFSH}}$ changes to a low level, the self-refresh signal $\phi$self changes to high level within a certain time (Ts).

Figure 3:
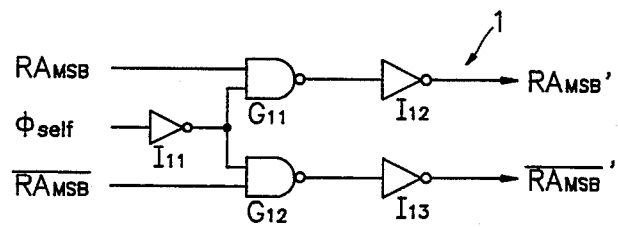
FIG. 3 is a schematic circuit diagram of the refresh cycle controller shown in FIG. 1 according to a preferred embodiment of the present invention.

FIG. 3 illustrates a schematic circuit diagram of the refresh cycle controller according to a preferred embodiment of the present invention. The refresh cycle controller 1 includes a first inverter $I_{11}$ having an input terminal connected to receive the self-refresh signal $\phi$self; a first NAND gate $G_{11}$ having one input terminal connected to the most significant bit $RA_{MSB}$ of the row address and another input terminal connected to the output of the first inverter $I_{11}$; a second NAND gate $G_{12}$ having an input terminal connected to the complement of the most significant bit line $\overline{RA_{MSB}}$ of the row address and another input terminal connected to the output of the first inverter $I_{11}$; a second inverter $I_{12}$ having an input connected to the output terminal of the first NAND gate $G_{11}$; and a third inverter $I_{13}$ having an input connected to the output of the second NAND gate $G_{12}$.

The refresh cycle controller 1 operates as follows.

When the self-refresh signal $\phi$self is low, output of the first inverter $I_{11}$ becomes high. The most significant bit $RA_{MSB}$ of the row address is gated through G and passes through and the complement of the most significant bit $\overline{RA_{MSB}}$ of the row address is gated by G and passes through $I_{13}$.

In data retention mode, the self-refresh signal $\phi$self is high and the output of the first inverter $I_{11}$ becomes low, thereby disabling gates $G_{11}$ and $G_{12}$. The output signals of the first and second NAND gates $G_{13}$ and $G_{12}$ are high, and outputs from $I11$ and $I13$ of the refresh cycle controller 1 become low, regardless of the input thereto. As a result, word lines that are decoded from the most significant bit $RA_{MSB}$ are deactivated. Therefore, the frequency of refresh cycles for the memory cells of memory 3 becomes $2^{(the\ number\ of\ bit\ lines\ of\ row\ address\ line)-1}$. In other words, by invalidating the most significant bit line of row address lines, the frequency of refreshing the memory cells in data retention mode is reduced by half.

Although the most significant bit line of the row address lines is taken as an example in this preferred embodiment of the present invention, the present invention is not so limited. The frequency of refresh cycles can be further reduced by including other row address bits. For example, when two row address bits, such as the most significant bit and the second most significant bit, are used, the frequency of refresh cycles is further reduced to one-quarter. And when three significant bits are used, the frequency of refresh cycles is further reduced to one-eighth. The number of row address bits used can be further increased in similar manner.

When the frequency of refresh cycles in data retention mode is reduced as described above by the refresh cycle controller 1, the number of memory cells to be refreshed each time is increased by a function of the reduction of frequency of refresh cycles. Therefore, the boosting level of word lines may drop. However, the dropping of boosting level can be compensted by increasing the boosting level of word lines using the word line boosting level generator 2.

The structure and operation of the word line boosting level generator 2 will be described hereinafter.

Figure 4:
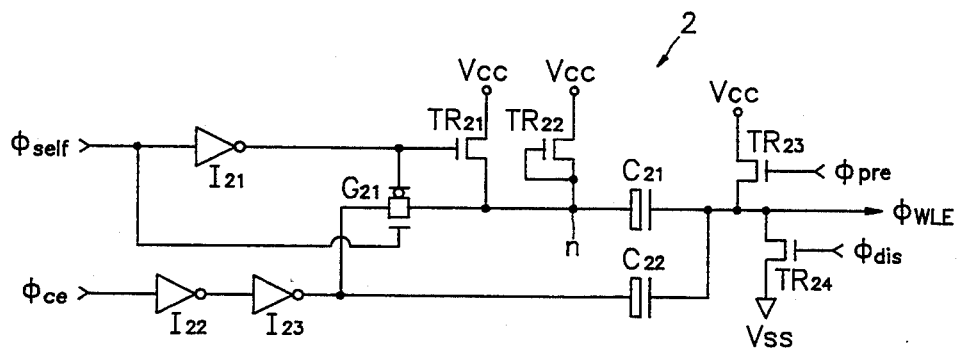
FIG. 4 is a schematic circuit diagram of the word line boosting level generator shown in FIG. 1 according to a preferred embodiment of the present invention.

FIG. 4 illustrates a schematic circuit diagram of the word line boosting level generator 2 according to the preferred embodiment of the present invention. The word line boosting level generator 2 includes a fourth inverter $I_{21}$ having an input terminal connected to receive the self-refresh signal $\phi$self; a fifth inverter $I_{22}$ having an input terminal connected to receive a clock enable signal line $\phi$ce; a sixth inverter $I_{23}$ having an input terminal connected to an output terminal of the fifth inverter $I_{22}$; a transmission gate $G_{21}$ having one control terminal connected between the self-refresh signal $\phi$self, another control terminal connected to receive the complement of $\phi$self from the output of the fourth inverter $I_{21}$, and an input terminal connected to the output of the sixth inverter $I_{23}$; a first field effect transistor (FET) $TR_{21}$ having a gate terminal connected to the output of the fourth inverter $I_{21}$, a drain terminal connected to the voltage supply $V_{CC}$ and a gate terminal and a source terminal connected to the output of the transmission gate $G_{21}$; a first metal oxide semiconductor (MOS) capacitor $C_{21}$ having one terminal connected to the output of the transmission gate $G_{21}$: a second metal oxide semiconductor capacitor $C_{22}$ connected between the output of the sixth inverter $I_{23}$ and one terminal of the first MOS capacitor $C_{21}$; a third field effect transistor $TR_{23}$ having a drain terminal connected to the voltage supply $V_{CC}$, a gate terminal connected to a precharge signal line $\phi$pre, and a source terminal connected to a node of the first and second MOS capacitors $C_{21}$ and $C_{22}$; and a fourth field effect transistor $TR_{24}$ having a drain terminal connected to the node of the first and second MOS capacitors $C_{21}$ and $C_{22}$, a source terminal connected to a voltage supply $V_{SS}$, and a gate terminal connected to an output disable signal $\phi$dis. The node of the first MOS capacitor $C_{21}$ and second MOS capacitor $C_{22}$ forms an output terminal $\phi_{WLE}$. The above transmission gate $G_{21}$ is an NMOS and a PMOS field effect transistor connected to each other. Its two gate terminals are the gate terminals of the two FETs and are used for controlling transmission of data from an input at the drain terminal of the transmission gate to the output at the source terminal of the transmission gate.

The operation of the word line boosting level generator 2 having the above-mentioned structure is as follows.

The third field effect transistor $TR_{23}$ precharges the output signal $\phi_{WLE}$ from voltage supply Vcc under control of precharge signal $\phi$pre. The output disable signal $\phi_{dis}$ allows a word line to drop to a low level when the device attains a precharged state after having been in an active state. When the output disable signal $\phi$dis is applied to the gate terminal of the fourth field effect transistor $TR_{24}$, the fourth field effect transistor $TR_{24}$ is turned on and the output signal $\phi_{WLE}$ is dropped to a low level. As a result, the output signal $\phi_{WLE}$ is disabled by the output disable signal $\phi_{dis}$. Thus, $\phi_{dis}$ must be dropped to a low level before $\phi$ce rises from a low level to a high level. If $\phi_{dis}$ is kept at a high level, the level of $\phi_{WLE}$ cannot be boosted to a satisfactory level.

If a low level self-refresh signal $\phi$self is applied to the input terminal of the fourth inverter $I_{21}$ (as when the semiconductor memory device is not in data retention mode) so that the output of the fourth inverter $I_{21}$ is high, input to the PMOS gate terminal of the transmission gate $G_{21}$ is high and input to its NMOS gate terminal is low. As a result, the transmission gate $G_{21}$ shuts off.

When the transmission gate $G_{21}$ shuts off, the clock enable signal $\phi$ce that passes through the fifth and sixth inverters $I_{22}$ and $I_{23}$ cannot pass through the transmission gate $G_{21}$. However, it is input to the second metal oxide semiconductor capacitor $C_{22}$. In this case, the boosting level of the word lines, which equals to the level of the output signal $\phi_{WLE}$, is a function of the electronic charge stored in the second metal oxide semiconductor capacitor $C_{22}$. If the level of the output signal $\phi_{WLE}$ rises, the potential of n-node rises, too. When the potential of node n rises to a certain level, the second field effect transistor $TR_{22}$ turns on. Thus, TR prevents node n from entering in a floating state when $\phi$self is low and $TR_{22}$ prevents node n from being raised by $C_{21}$ when $\phi_{WLE}$ is boosted by $\phi_{LE}$ in the case where $\phi$self is low. If node n attains a high level, a latch-up may occur in PMOS of the transmission gate $G_{21}$. As a result, the potential of node n is kept at a predetermined level.

If a high level self-refresh signal $\phi$self is applied to the input terminal of the fourth inverter $I_{21}$ (as when the semiconductor memory device is indata retention mode), the output signal of the fourth inverter $I_{21}$ becomes low. Input to the NMOS gate terminal of the transmission gate $G_{21}$ is therefore high while input to its PMOS gate is low. As a result, the transmission gate $G_{21}$ turns on.

When the transmission gate $G_{21}$ turns on, the clock-enable signal $\phi$ce that passes through the fifth and sixth inverters $I_{22}$ and $I_{23}$ passes through the transmission gate $G_{21}$ to the first metal oxide semiconductor $C_{21}$, as it also passes to the second metal oxide semiconductor $C_{22}$. The electrical charge that is stored in the first and second metal oxide semiconductor capacitors $C_{21}$ and $C_{22}$ will become the output signal $\phi_{WLE}$. The level of output signal $\phi_{WLE}$ is now a function of the total capacitance of both the first and second metal oxide semiconductor capacitors $C_{21}$ and $C_{22}$, which is increased by the first metal oxide semiconductor capacitor $C_{21}$. The increase in stored electric charge prevents a decrease of the boosting level word lines which may result from an increase of the number of word lines to be refreshed when the frequency of the refresh cycles is reduced in data retention mode.

As mentioned above, the present invention provides a semiconductor memory device having a circuit for reducing the frequency of refresh cycles in data retention mode, but the sensing margin of bit lines of which is not deteriorated because the boosting level of word lines is raised.

What is claimed is:

1. A semiconductor memory device comprising: a memory including a plurality of word lines for accessing data stored in the memory;
    a refresh cycle controller for controlling the frequency of the refresh cycles in data retention mode based upon at least one row address bit and a self-refresh signal, the refresh cycle controller comprising means for separately gating said at least one row address bit and a complement of said at least one row address bit and a complement of said at least one row address bit in response to said self-refresh signal; and
    a word line boosting level generator for increasing a boosting level of said word lines to said memory in data retention mode in response to said self-refresh signal and a clock-enable signal.

2. A semiconductor memory device as in claim 1, wherein said gating means include:
    a first inverter having an input terminal receiving said self refresh signal;
    a first NAND logic circuit having input terminals respectively connected to said at least one row address bit and an output terminal of said first inverter; and
    a second NAND logic circuit having input terminals respectively connected to a complement of said at least one row address bit and the output terminal of said first inverter.

3. A semiconductor memory device as in claim 1, wherein said gating means includes:
    a first inverter having an input terminal receiving said self-refresh signal;
    a first NAND gate having input terminals respectively connected to said at least one row address bit and an output terminal of said first inverter;
    a second NAND gate having input terminals respectively connected to a complement of said at least one row address bit and the output terminal of said first inverter;
    a second inverter having an input terminal connected to an output terminal of the first NAND gate; and
    a third inverter having an input terminal connected to an output terminal of the second NAND gate.

4. A semiconductor memory device comprising:
    a memory including a plurality of word lines for accessing data stored in the memory;
    a refresh cycle controller for controlling the frequency of refresh cycles in data retention mode based on at least one row address bit and a self-refresh signal; and
    a word line boosting level generator for increasing a boosting level of said word lines to said memory in data retention mode in response to said self-refresh signal and a clock-enable signal, said word line boosting level generator comprising:
        a fourth inverter receiving said self-refresh signal;
        a fifth inverter receiving said clock-enable signal;
        a sixth inverter having an input terminal connected to an output terminal of said fifth inverter;
        a transmission gate having a control terminal connected between the self-refresh signal and an output terminal of the fourth inverter, and an input terminal connected to an output terminal of the sixth inverter;
        a first field effect transistor having a gate terminal connected to the output terminal of the fourth inverter, a drain terminal connected to a voltage supply Vcc, and a source terminal connected to an output terminal of the transmission gate;
        a second field effect transistor having a drain terminal connected to the voltage supply Vcc and a gate terminal and a source terminal connected to the output terminal of the transmission gate;
        a first metal oxide semiconductor capacitor having one terminal connected to the output terminal of the transmission gate;
        a second metal oxide semiconductor capacitor having one terminal connected to the output terminal of the sixth inverter, and another terminal connected to another terminal of the first MOS capacitor;
        a third field effect transistor having a drain terminal connected to the voltage supply Vcc, a gate terminal connected to a precharge signal line, and a source terminal connected to a node formed by said another terminals respectively of the first and second metal oxide semiconductor capacitors; and
        a fourth field effect transistor having a drain terminal connected to the node of the first and second metal oxide semiconductor capacitors, a source terminal connected to a voltage supply Vss, and a gate terminal connected to an output disable signal.

* * * * *

UNITED STATES PATENT AND TRADEMARK OFFICE
CERTIFICATE OF CORRECTION

PATENT NO. : 5,333,128
DATED : July 26, 1994
INVENTOR(S) : Seiseung Yoon; Moongone Kim It is certified that error appears in the above-indentified patent and that said Letters Patent is hereby corrected as shown below:

Column 1, line 40, after "reading" delete "out".
Column 2, line 9, after "description" delete "of".
Column 3, line 9, change "G" to -- $G_{11}$ --.
Column 3, line 11, change "G" to -- $G_{12}$ --.
Column 3, line 16, change "$G_{13}$" to -- $G_{11}$ --.
Column 3, line 17, change "I11 and I13" to
          -- $I_{11}$ and $I_{13}$ --.
Column 3, line 45, change "compensted" to
          -- compensated --.
Column 4, line 63, change "TR" to -- $TR_{21}$ --.
Column 5, line 5, change "indata" to -- in data --.

Column 5, lines 45, 46, delete "and a complement of said
          at least one row address bit" (second
          occurrence).
Column 6, line 56, change "terminals" to -- terminal --.

Signed and Sealed this

Eleventh Day of April, 1995

Attest:

BRUCE LEHMAN

Attesting Officer      Commissioner of Patents and Trademarks